(12) United States Patent
Cook et al.

(10) Patent No.: US 6,356,086 B1
(45) Date of Patent: Mar. 12, 2002

(54) METHOD AND APPARATUS FOR THE IN-CIRCUIT TESTING OF A CAPACITOR

(75) Inventors: Terry D. Cook; Curt Hartse, both of Sioux Falls, SD (US)

(73) Assignee: Sencore, Inc., SD (US)

( * ) Notice: Subject to any disclaimer, the term of this patent is extended or adjusted under 35 U.S.C. 154(b) by 0 days.

(21) Appl. No.: 09/289,818

(22) Filed: Apr. 12, 1999

(51) Int. Cl.[7] .............................................. G01R 27/26
(52) U.S. Cl. ...................................................... 324/659
(58) Field of Search ................................. 324/659, 679, 324/61 R, 60; 333/214; 327/552; 73/304 C

(56) References Cited

U.S. PATENT DOCUMENTS 4,250,490 A * 2/1981 Dahlke .................. 340/870.37
5,283,528 A * 2/1994 Van Seeters ................ 324/679

* cited by examiner

Primary Examiner—Safet Metjahic
Assistant Examiner—E P LeRoux
(74) Attorney, Agent, or Firm—Patnaude & Videbeck

(57) ABSTRACT

A test apparatus and method of testing a capacitor while it is still in-circuit incorporation a sequence of tests including a DC capacitance value measurement, a measurement of the DC current paths in parallel with the capacitor, a measurement of the equivalent series resistance of the capacitor, and an AC impedance measurement of the capacitor and its associated circuitry.

20 Claims, 2 Drawing Sheets

METHOD AND APPARATUS FOR THE IN-CIRCUIT TESTING OF A CAPACITOR

Figure 1:
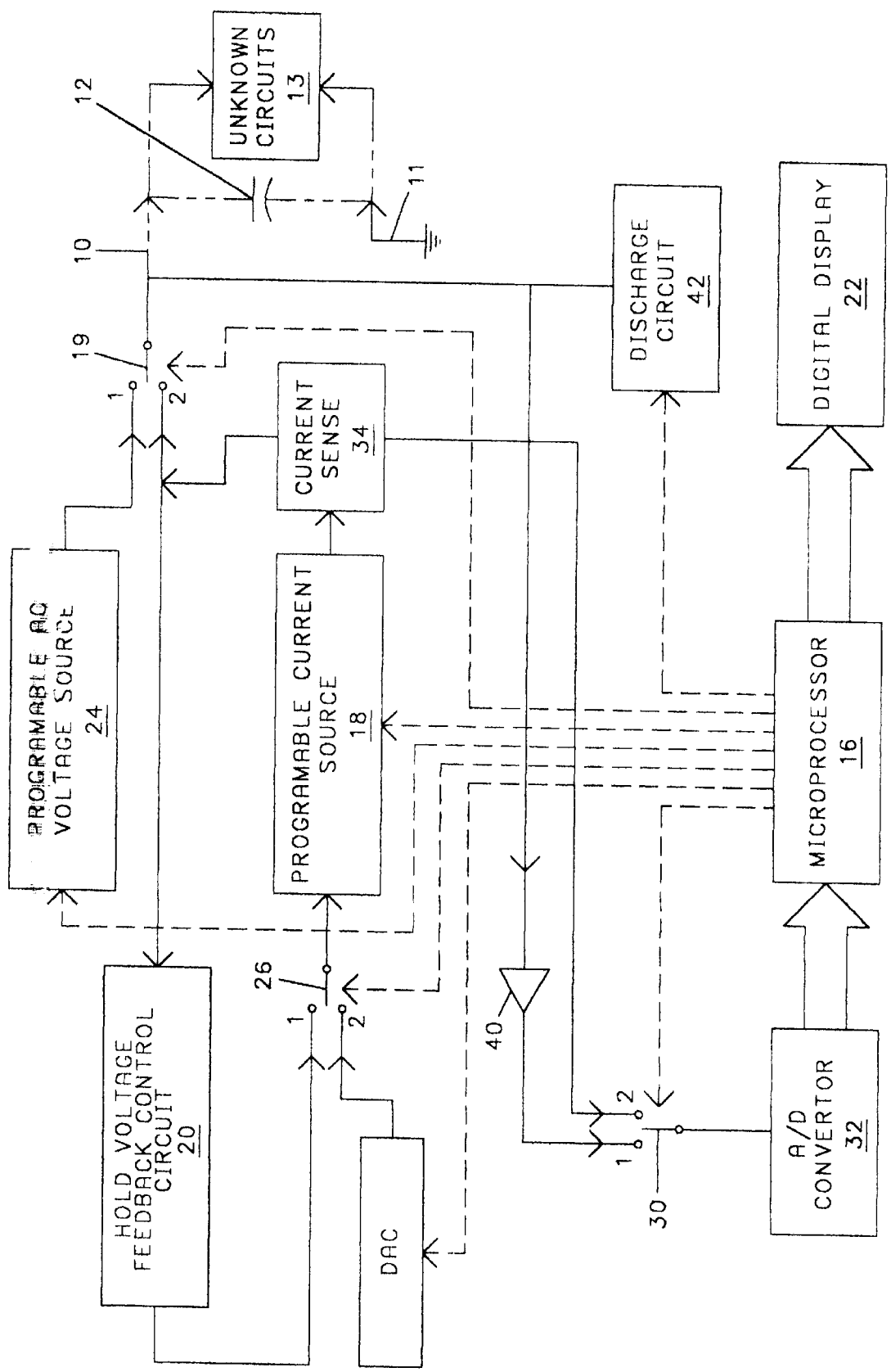

The present invention generally relates to the testing of a capacitor without disconnecting the capacitor from the circuit in which it is connected.

BACKGROUND OF THE INVENTION

Capacitors have always had a relatively high failure rate when compared to other electronic components and thus require frequent testing when a problem arises in the operation of an electronic circuit. While recent improvements in the processes used to manufacture capacitors have improved the reliability of present day capacitors, they still have a relatively high failure rate. Moreover, the use of capacitors has been increasing, wherefore the need to accurately and quickly determine if a capacitor has failed is of great importance.

It has long been believed that capacitors could not be reliably tested without first removing the capacitors from the associated circuitry because of the effects that other circuit components could have on the test measurement. Therefore, in order to accurately test capacitors, technicians have had to remove the capacitors from the circuits in which they were connected, then make the necessary test measurements, and if the capacitors were determined to be good, to reconnect them into the circuit. Of course, if they were determined to be bad, they were replaced by good capacitors, Especially if the capacitor is connected to a printed circuit, this is a very time consuming and delicate procedure if damage to the associated printed circuit is to be avoided. Indeed, the increasing use of miniature surface mounted capacitors has exacerbated the problem since these capacitors are extremely small and fragile. Accordingly, special tools are required to handle these miniature capacitors, and many technicians do not have such tools or the expertise to use them.

Various methods and instruments have been used in the past to measure the capacitance of capacitors. For example, impedance bridges have been used to apply a signal of known amplitude and frequency to a capacitor under test, but such methods and instruments cannot be used to measure the capacitance of an in-circuit capacitor because of the effects of the associated circuits on the measurements. Moreover, other common failure modes of a capacitor are not detected by the use of these bridges. Other methods and instruments have been used to measure the ESR, equivalent series resistance, of an in-circuit capacitor at low voltage levels so that the effects on the measurements are minimized. However, such instruments do not show if the capacitance value is within tolerance limits or if there is any leakage internally of the capacitor or in the associated circuit.

Other capacitor testing systems have also been proposed, but they too have been ineffective to make accurate measurements of the important characteristics of a capacitor under test. Therefore, it would be desirable to provide a method and apparatus for analyzing the characteristics of a capacitor while that capacitor is connected in circuit with other electric components.

SUMMARY OF THE INVENTION

Briefly, in accordance with the teachings of the present invention, a capacitor can be tested while connected to other electronic components in an associated circuit and such test will determine whether the capacitor is good or bad or in some cases should be removed from the associated circuit for further testing. This test method and instrument makes a sequence of tests on a capacitor while the capacitor is connected to other electronic components or even disconnected therefrom, which tests include a DC capacitance value measurement, a measurement of the DC current paths in parallel with the capacitor, a measurement of the equivalent series resistance of the capacitor, and an AC impedance measurement of the capacitor and its associated circuitry. It is the sequencing of these four tests and the analysis of the individual test results that enable the technician to determine if a capacitor is either good or bad. In some rare instances, the test results may be questionable and in those cases the technician is advised to disconnect the capacitor under test from the associated circuitry and to repeat the test.

The instrument described in the detailed description to follow herein automatically makes the above-described tests one after another and analyzes the resulting measurements to provide a visual indication to the technician as to whether the capacitor under test is good or bad.

GENERAL DESCRIPTION OF THE DRAWINGS

Figure 2:
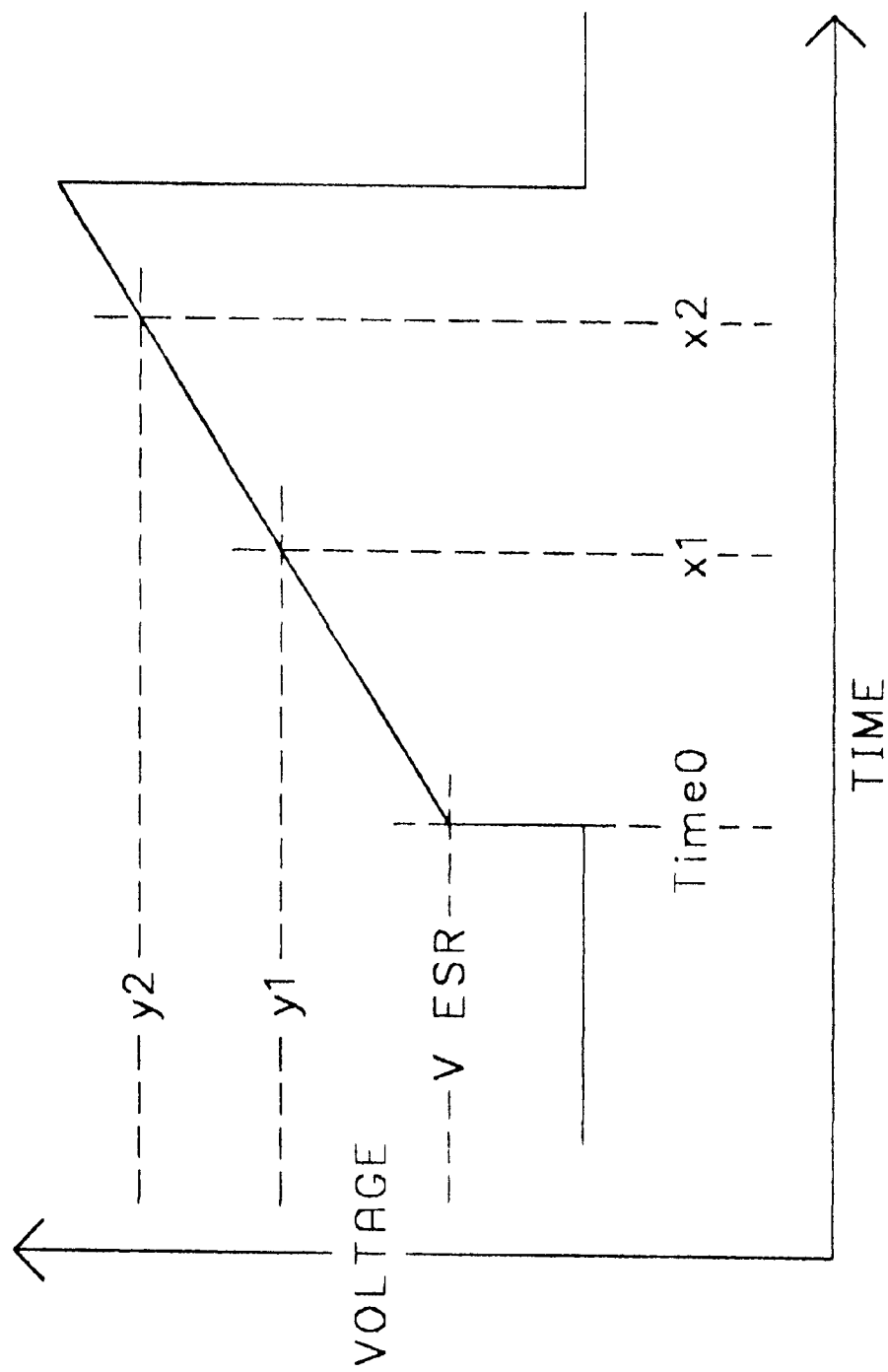

The present invention will be better understood by reference to the accompanying drawings wherein:

FIG. 1 is a block system diagram of those parts of a test instrument useful in carrying out the method of the present invention; and FIG. 2 is a graph illustrating the manner in which the ESR of a capacitor is measured by the instrument shown in FIG. 1.

DETAILED DESCRIPTION OF A PREFERRED EMBODIMENT

As is described in greater detail hereinafter in connection with FIG. 1, a pair of test leads 10 and 11 are adapted to be connected to the respective terminals of a capacitor 12 under test while that capacitor is connected in an associated circuit 13. When the test leads are connected as shown in FIG. 1, a test switch (not shown) is actuated to initiate the test, and the method of the present invention is automatically carried out as the test instrument initiates four separate measurements in sequence resulting in a digital display of the operativeness of the capacitor 12.

In accordance with this novel method of testing an in-circuit capacitor, the first step in the method is to measure the capacitance value of the capacitor 12 by charging the capacitor 12 with a constant DC current from a current source 18 via a relay switch 19 and measuring the time required to charge the capacitor under the test between two known DC voltage levels. The capacitance is then calculated by the microprocessor 16 using the following formula:

$$C=(T*I)/V$$

where:

C=capacitance value in Farads

T=time in seconds for the change in voltage V to occur

I=charging current in Amperes

V=change in voltage across the capacitor in Volts

Upon completion of the first test, a second test is performed to measure the effects of any DC current paths in the circuit 13 in parallel with the capacitor 12 to determine if the results of the previously made DC capacitance value test could have been affected by the circuit 13. This measurement is made by connecting a constant voltage source 20 the capacitor 12 via the relay switch 19. If the current required to hold the voltage across the capacitor 12 constant is greater than a predetermined level a selected percentage of the current current it will be evident that the capacitor should be disconnected from the circuit 13 and the sequence of tests repeated. We have found that a current value equal to or greater than twenty percent of the current used to make the DC capacitance value measurement may render the previous test invalid. If that is the case, the technician is advised that the capacitor should be disconnected from the circuit 13 and the test repeated.

Assuming that the first two tests have not indicated a need to disconnect the capacitor from the associated circuit for further testing, a third test is then carried out. In this third test, the equivalent series resistance (ESR) is first determined by applying a constant current to the capacitor under test 12 and simultaneously measuring the instantaneous voltage across the capacitor. The results of this test taken with the previously measured DC capacitance value and the known voltage rating of the capacitor is used to determine if the capacitor is bad. The values for maximum ESR as established by Electronic Industries Standards are stored in the microprocessor and used in the determination as to whether the capacitor under test is good or bad. The ESR is first calculated by observing the instantaneous voltage across the capacitor when the current source is first switched to the capacitor, and the ESR is calculated a second time by finding the slope of the charging voltage curve across the capacitor by using the following formula:

$$M=(y2-y1)/(x2-x1)$$

where:

M=slope y2−y1=change in voltage across the capacitor x2−x1=change in time

FIG. 2 is a diagram showing the points on the capacitor charge curve used in calculating the value of ESR.

The slope is then used to calculate the voltage at time zero using the following formula:

$$E=y1-(x1*m)$$

where E is the voltage at time zero.

If the results of the two methods differ by greater than fifty percent (50%), it is assumed that there is a parallel path in the circuit 13 affecting the ESR measurement, and an indication is given to the technician via the display 22 to disconnect the capacitor from the associated circuit and to again test the capacitor.

Finally, the capacitor 12 under test is switched via the relay switch 19 to an AC voltage source 24 to ascertain if the capacitor under test is the dominant reactive component in the circuit 13 in which it is connected. If the capacitor is indeed the dominant reactive component, the impedance measured across the capacitor is approximately equal to the Capacitive Reactance. If not, the measurement made may be erroneous. The voltage source 20 has a known output impedance of say 50 Ohms and the reactive value of the capacitor 12, Xc, can thus be calculated. Also, the frequency required to produce that known capacitive impedance value is calculated using the following formula:

$$F=1/(2*PI*Xc*C)$$

where:

F=the frequency of the applied voltage

C=the measured capacitance value of the capacitor 12

Xc=the calculated capacitive reactance

PI=3.14159

If the level of the signal measured across the capacitor and associated circuitry differs by more than a predetermined amount, say 20 percent, the technician is advised to disconnect the capacitor from the associated circuit and retest it.

Considered in greater detail, when the test instrument has been connected to the capacitor 12 and its associated circuit 13 via the test leads 10 and 11, the DC capacitance is first measured. In carrying out this test, the relay 19 is set to position 2 to connect the programmable current source to the test lead 10. The test lead 11, as shown, is permanently grounded. A second switch 26, a solid state switch under control of the microprocessor 16, is set to position 2 to connect the output of the current source 18 to the DAC so that the current source 18 is controlled by the DAC 28. A third switch 30, a solid state switch, is set to position 1 allowing the charging voltage ramp developed across the capacitor under test 12 to be sampled by the A/D converter 32. The A/D converter 32 is then started, and the current source 18 is activated to initiate charging of the capacitor 12. When the capacitor 12 has charged to a level above 350 mV, the A/D converter 32 is shut off, and the switch 26 is switched to position 1 which switches the current source 18 to the hold voltage feedback control circuit 20 which then holds the voltage across the capacitor 12 at 300 mV. The data which had been generated by the A/D converter is analyzed by the microprocessor 16 to determine how many of the sampled measurements occurred between two known voltage levels. The number of samples is multiplied by the period of the sample clock used by the A/D converter 32 to determine the charge time. Knowing the charge time, the charging current, and the change in voltage across the capacitor under test, the following formula is used to calculate the capacitance of the capacitor under test:

$$C=(T*I)/V$$

where:

C=capacitance value in Farads

T=time in seconds

I=charging current in Amperes

V=change in voltage across the capacitor in Volts

Solid state switch 30 is set to position 2 to connect the current sense circuit 34 to the A/D converter. The output of the current sense circuit 34, which is the current to the capacitor, is then measured by the A/D converter 32 and connected to the microprocessor 16. The voltage measured at the output of the current sense circuit 34 is proportional to the current necessary to maintain a charge of 300 mV across the capacitor 12 and the associated circuitry 13. If this current is greater than 20 percent of the current used to make the DC capacitance measurement, the display suggests to the technician that the capacitor be disconnected from the circuit and retested. Following completion of the measurement of the DC parallel current paths, the current source 18 is then shut off, the capacitor 12 is discharged by a discharge circuit 42 under the control of the microprocessor 16.

The ESR is then measured by setting the switch 26 to position 2 to connect the DAC to the current source 18 whereby the current source is controlled by the DAC.

The switch 30 is set to position 1 whereby the voltage across the capacitor is connected via a buffer 40 to the A/D converter for measurement. The A/D converter 32 is started and the current source 18 is turned on so that the ESR of the capacitor 12 and associated circuit 13 can then be measured twice as described hereinabove.

Following the multiple ESR test, the AC test is carried out to confirm the results of the DC capacitance measurement previously performed. In making the AC test, the relay switch 19 is set to position 1 to connect the AC voltage source to the test lead 10. Based on the previously measured DC capacitance value test, the frequency at which the impedance Xc would equal a known value is calculated by the microprocessor 16. Using the calculated value of Xc and the measured ESR of the capacitor 12 and associated circuit 13 the expected peak-to-peak voltage across the capacitor 12 is determined.

The A/D converter 32 is then started, and it samples the AC voltage across the capacitor 12 for a minimum of one cycle. The data thus generated by the A/D converter is then searched within the microprocessor to find the most positive and most negative voltage values measured. The difference between the two is equal to the peak-to-peak voltage across the capacitor 12. This value is then compared with the previously calculated value to determine whether or not the reactive impedance of the capacitor is the dominant reactive impedance in the circuit 13 including the capacitor 12. Should the measured and calculated values differ, the display suggests to the technician that the capacitor be disconnected from the circuit and retested.

It may thus be seen that the method and instrument described herein enables a technician to quickly and accurately test a capacitor to determine if it is good or bad without first removing the capacitor from an associated circuit. Moreover, if the associated circuit prevents such an accurate measurement, the technician is advised to disconnect the capacitor for the associated circuit and to repeat the test by connecting the test lead 10 to the capacitor 12 after it has been isolated. As compared to ESR meters presently on the market, this method and instrument does a superior job because it prevents the technician from being misled by shorted capacitors, very leaky capacitors, or even a resistor that one may mistake for a capacitor. This test also determines if there are any parallel current paths which could lead to inaccurate test results. Finally, the method and instrument disclosed herein suggests to the technician that the capacitor under test in some circumstances be disconnected from those to which it is connected and retested.

While the present invention has been described in connection with a preferred embodiment, it will be understood by those skilled in the art that many changes and modifications can be made without departing from the true spirit and scope of the present invention. Therefore, in the appended claims, it is intended to cover all such changes and modifications which truly come within the true spirit and scope of the invention.

What is claimed:

1. A method of testing a capacitor connected in circuit with other components, comprising the steps of,
   measuring the capacitance of said capacitor and said other components while in circuit therewith,
   determining if there are parallel current paths in said circuit in parallel with said capacitor and repeat the measurement of capacitance if the effect of said parallel paths exceeds a predetermined value,
   measuring the ESR of said capacitor and the said electronic components in circuit therewith, and
   measuring the capacitive reactance of said capacitor and said components in circuit therewith.

2. The method according to claim 1, wherein said step of measuring the capacitance of said capacitor is carried out by,
   applying a constant DC current to said capacitor and said other components in circuit therewith and simultaneously measuring the voltage developed across said capacitor.

3. The method according to claim 2 wherein the presence of said parallel current paths is determined by,
   applying a constant DC voltage across said capacitor while measuring the current to said capacitor and said other components in circuit therewith.

4. The method according to claim 3 wherein the ESR of said capacitor is measured by,
   applying a constant current to said capacitor and said other components in circuit therewith, and
   measuring the voltage across said capacitor at the time said current is initially applied to said capacitor.

5. The method according to claim 4 wherein the ESR of said capacitor is measured a second time by,
   measuring the slope of the change in voltage across said capacitor while said capacitor is charging.

6. The method according to claim 5 wherein the two values of ESR determined by said two ESR measuring steps are compared.

7. The method according to claim 6 wherein,
   the capacitive reactance of said capacitor and the other components in circuit therewith is measured by,
   applying an AC current to said capacitor and the other components in circuit therewith, measuring the AC voltage developed across said capacitor, and
   calculating the reactance of said capacitor and the other components in circuit therewith using said measured AC voltage.

8. The method according to claim 7 wherein the reactance calculated using the voltage measured across said capacitor while AC current is applied to said capacitor comprising the further step of,
   calculating the reactance of said capacitor using the capacitance previously measured in the first step of said method, and
   comparing the two calculated values of said reactance.

9. The method according to claim 8, wherein said steps are carried by,
   first measuring the capacitance of said capacitor while said capacitor is in circuit with said other components,
   then determining if said parallel current paths exist,
   then measuring the ESR of said capacitor, and
   then determining if the capacitive reactance is the dominant reactance in said circuit in which said capacitor is connected.

10. A test instrument for checking a capacitor connected in circuit with other electronic components, comprising in combination,
    a constant DC current source,
    means for connecting said DC current source to said capacitor,
    means for measuring the voltage across said capacitor while said source is connected thereto,
    a constant voltage source,
    means for connecting said constant current voltage source across said capacitor,
    means for measuring the current to said capacitor, and
    means for comparing said measured current to a predetermined current value.

11. The instrument according to claim 10, further comprising means for measuring the ESR of said capacitor.

12. The instrument according to claim 11, further comprising means for measuring the capacitive reactance of said capacitor.

13. The instrument according to claim 11 wherein said means for measuring the ESR of said capacitor comprises, means for applying a constant DC current to said capacitor, means for measuring the voltage across said capacitor when said constant current source is initially connected thereto, means for measuring the slope of the voltage current charging curve while said capacitor is being charged with said constant DC current, and means for calculating two values of the ESR of said capacitor, one using said measured voltage when said current is initially supplied to said capacitor to provide one value of ESR and two, using said slope to calculate another value of ESR.

14. The instrument according to claim 13, further comprising in combination, means for applying an AC current to said capacitor, and measuring the voltage across said capacitor while said AC current is supplied thereto.

15. An instrument for testing a capacitor connected in circuit with other components, comprising in combination means for automatically carrying out the steps set forth in claim 9 in sequence.

16. An instrument according to claim 15 comprising, means for displaying a message suggesting that said capacitor be disconnected from said other components if parallel current paths result in a current greater than a predetermined value.

17. An instrument according to claim 15 comprising, means for displaying a message suggesting that said capacitor be disconnected from said other components if the two measurements differ by more than a predetermined value.

18. The instrument according to claim 14 comprising, means for displaying a message suggesting that said capacitor be disconnected from said other components and retested if said two calculated values of capacitive reactance differ from one another by more than a predetermined amount.

19. The instrument according to claim 18 wherein said predetermined amount is in the order of twenty percent of the higher of the two calculated values.

20. The instrument according to claim 13 comprising means for displaying a message suggesting that the capacitor be disconnected from said other components and retested if said two values of ESR differ from one another by about fifty percent or more.

* * * * *